United States Patent [19]

Lisle, Jr. et al.

[11] 3,956,746
[45] May 11, 1976

[54] SUCCESSIVELY RANGED A/D CONVERTER WITH ERROR CORRECTION

[75] Inventors: Thomas K. Lisle, Jr., Baltimore; Jerome C. Beard, Pasadena; Thomas W. Balma, Columbia, all of Md.

[73] Assignee: Westinghouse Electric Corporation, Pittsburgh, Pa.

[22] Filed: Jan. 7, 1975

[21] Appl. No.: 539,133

[52] U.S. Cl. .................................... 340/347 AD
[51] Int. Cl.² ..................................... H03K 13/02
[58] Field of Search ......................... 340/347 AD

[56] References Cited
UNITED STATES PATENTS

| | | | |
|---|---|---|---|
| 3,072,332 | 1/1963 | Margopoulos | 340/347 AD |
| 3,493,958 | 2/1970 | Gorbatenko | 340/347 AD |
| 3,646,586 | 2/1972 | Kurz | 340/347 AD |

OTHER PUBLICATIONS

Verster "IEEE Transactions on Electronic Computers" Aug. 1964, pp. 471–473.

*Primary Examiner*—Charles D. Miller
*Attorney, Agent, or Firm*—D. Schron

[57] ABSTRACT

An analog-to-digital conversion circuit of the type employing a feedback-type, successive subranging mode of operation is provided. The circuit achieves bipolar input capability using an internal subranging A/C converter which has only a unipolar capability using a single level, unipolar, add-only binary summer to combine successive subranges. The foregoing have been achieved by means of a novel combination of relatively simple circuit elements which have fast settling times.

1 Claim, 8 Drawing Figures

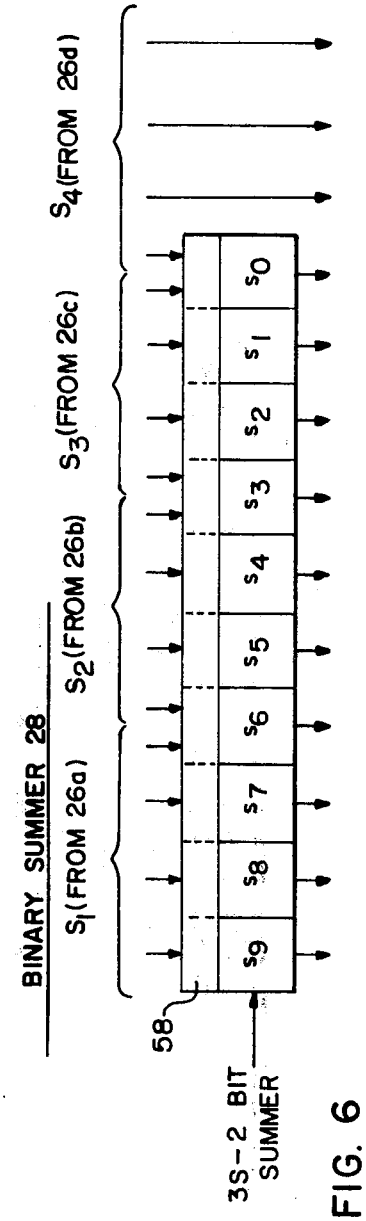

(HYPOTHETICAL PRIOR ART)

SUCCESSIVELY RANGED A/D CONVERTER WITH ERROR CORRECTION

BACKGROUND OF THE INVENTION

This invention relates to improvements in digital processing circuitry for performing analog-to-digital (A/D) conversion of a bipolar analog signal, such circuitry being of the type which employs the technique of feedback-type, successive ranging. By this technique, a circuit provides a digital number output word containing a total range of M bits, by iterative use of a fast, internal, A/D converter circuit which produces a subrange conversion word of a fewer number of bits, S. The invention is of particular utility in applications for which mass reproducible circuit constructions are employed. Such mass reproducible circuit constructions, such as integrated circuits, are limited in linearity, fidelity, and accuracy.

There has been a continuing effort to achieve higher speeds of conversion. A high priority motivation behind this effort is the application of A/D conversion circuits to the performance of complex analysis of radar signals. In this application, higher conversion speeds are desired in order to more thoroughly analyze the signal within real-time constraints, and to build the equipment to be compatible with cost constraints and size of the equipment constraints.

One approach to improving conversion speeds stems from recognition of the importance of efficient utilization of the flip-flop stage capacity of the internal, subranging, A/D converter. This is illustrated in U.S. Pat. No. 3,483,550 which employs a bipolar subranging A/D converter. The bipolar subranging A/D converter therein does not require use of any of its A/D flip-flop stages to process the polarity sign information. Instead, the polarity sign information is manipulated by auxiliary logic. In turn, the auxiliary logic is operatively associated with the arithmetic circuitry which combines the results of iterative subrange conversions. The one flip-flop stage of the subranging A/D converter which becomes available for quantitative manipulations by this technique picks up one extra bit of representation for each iteration, thereby achieving faster conversions. However, the approach of manipulating the polarity sign by the auxiliary logic perpetuates a need for the generally slower bipolar, addition and subtraction arithmetic circuitry.

Another approach to improving conversion speeds stems from recognition of the importance of using arithmetic circuit structures which have fast settling times. This is illustrated in U.S. Pat. Nos. 3,541,315 and 3,581,304. In those patents, bias is fed into the analog subtractor at the point at which the feedback is returned. This bias is chosen to maintain a relationship by which the feedback is smaller than the input signal. The result which this provides is that every successive subrange conversion may be added to the preceding subrange. It permits use of unipolar, add-only, arithmetic circuitry which affords the advantage of its inherently faster settling times.

Prior to the present invention, there has been no instance of an A/D conversion circuit which avoids the slowness of bipolar, addition and subtraction circuitry while obviating the problem of inefficient utilization of the flip-flop stage capacity of the subranging A/D converter and which avoids the slowness of bipolar, addition and subtraction circuitry.

SUMMARY OF THE INVENTION

Analog-to-digital conversion circuit apparatus for a bipolar input is disclosed, which is of the type which employs successive subranging by means of an internal A/D converter of smaller bit capacity, S, than the number of bits, M, of the binary number output word. The numerical values representable by an M bit binary number output word represent the total range of the circuit apparatus.

More particularly, the circuit apparatus is of the type employing successive negative feedback of accumulative combinations of prior cycles of subrange conversion in order to successively apply the residue to the subranging A/D converter. The circuit apparatus has two main sub-parts consisting of a feedforward section and a feedback section.

The following elements comprise the feedforward section. The input of the circuit apparatus is an analog signal differential summing junction for differentially combining the input signal and the signal which is produced from the feedback section. The output of the summing junction is applied to a switchable gain amplifier. The gain of the switchable gain amplifier is varied by predetermined gain increments and in predetermined timed relationship to the operation of the subranging A/D converter to make the appropriate adjustments of gain of the difference signal at the output of the summing junction. The gain increments of the amplifier are $2^{(n-1)(S-1)}$, where n is the sequential number of subrange conversion being processed by the switchable gain amplifier. This amplifies each difference signal to a level which enables the subranging A/D converter stage (which is located further on in the signal path in the feedforward section) to transform it to the next subrange of most significant bits. The output of the switchable gain amplifier is applied to a network which offsets its voltage level by a small predetermined magnitude and polarity of voltage which is cooperative with the operation of the A/D converter. The function performed by this offset will be described following the description of the A/D converter. From the offset network the signal is applied to the subranging A/D converter which has the capability of processing only a single predetermined polarity of analog input signal. It is an inherent characteristic of an A/D converter stage when operating by itself to produce a digital number output word whose value fails to exactly correspond to the magnitude of analog input signal by a so-called "least significant bit" (LSB) error in the range ± ½ of the binary number system digit position value of the least significant bit of its output word. The term position value means the power of the radix (in this case power of "2") associated with the digit position. The function of the small predetermined shift introduced before the signal is applied to the subranging A/D converter is to cause the LSB error to always be unipolar. A binary summer and associated control gates and registers are operated in synchronism with the iterative subrange conversions performed by the subranging A/D converter.

Successively produced subrange conversion words are loaded in the binary summer according to their relative position in the total range of M bits. More particularly, the binary summer is so constructed and arranged that the successively produced subrange conversion words are received in the storage elements with an overlap of the most significant bit (MSB) of each successive word with the least significant bit (LSB) of the preceding output word. The alignment of the words in the summer is:

| First conversion  | $2^{S-1}$ — — $2^1$ | $2^0$ |           |
|-------------------|---------------------|-------|-----------|
| Second conversion |                     |       | $2^{S-1}$ — — $2^{-1}2^0$ |

The process is repeated until enough conversions have been made to produce M bits at the output. For example, where a total of M bits in the output is desired, a complete conversion might be:

| 1st Conversion | $2^{S-1}$ — — — — $2^1$ | $2^0$ | | |
|---|---|---|---|---|
| 2nd Conversion | | $2^{(S-1)}$ — — — $2^1$ | $2^0$ | |
| 3rd Conversion | | | | $2^{(S-1)}$ — — $2^{-1}2^0$ |
|  | $2^{M-1}$ — — $2^{(2S-1)}$ | $2^{2(S-1)}$ — — $2^S$ | $2^{(S-1)}$ — — $2^{-1}2^0$ |

The feedback section comprises the following elements. A two-to-one (2:1) digital channel multiplex switch of conventional logic gate construction has two inputs. One input receives the binary sum word in the binary summer, which is the combination of successively produced subrange conversion words. The other input receives a predetermined fixed binary number chosen to cooperate in the application of the feedback signal through the analog signal differential summing junction to convert the bipolar analog input signal to a unipolar analog signal of the predetermined polarity which is the subranging A/D converter can process. The 2:1 channel multiplex switch passes the latter input in predetermined timed relationship to the start of the processing of the input analog signal to cause conversion of same to the appropriate polarity prior to the first subrange conversion. After the first subrange conversion, the 2:1 channel multiplex switch operates to pass the successively produced binary number sum word in the binary summer in predetermined timed relationship to the processing of the second and subsequent subranges by the subranging A/D converter. A digital-to-analog D/A converter is connected to the output side of the 2:1 channel multiplex switch and receives whichever of the two channels are passed to it by the 2:1 channel multiplex switch. It converts the binary number word into an analog signal and applies it to the analog signal differential summing junction described as a component of the feedforward section, and more particularly to the input of such summing junction which is for receiving the feedback signal.

At the beginning of the process of successive subranging, the 2:1 digital channel multiplex switch is a condition in which it passes the predetermined fixed binary number word to the D/A converter. The output of the D/A converter is then the analog offset which goes into the analog signal differential summing junction. Any analog input signal having other than a predetermined polarity which the subranging A/D converter can convert is shifted and becomes a signal of the desired polarity before going to the subranging A/D converter. In the first conversion of a subrange the switchable gain network amplifies the output from the summing junction with unity gain. The signal thence goes to the network which introduces the small voltage level shift to cause the LSB error out of the subranging A/D converter to be unipolar. From the network which introduces the small voltage level shift it is applied to the subranging A/D converter and is converted into the first subrange of the total number of bits of output. The first subrange conversion word is switched into the binary summer through the associated control gates and registers. Then the binary sum word in the binary summer is propagated to the 2:1 channel multiplex switch, which for the second and successive subrange conversions is actuated to the condition in which it passes such binary sum word to the D/A converter. Thus, the binary number words representing the first subrange and successive combinations of subranges become the feedback signals. They are subtracted from the bipolar analog input signal and the difference or residue goes through the switchable gain amplifier where they are amplified up to the levels required for the conversion of the second and subsequent conversion of subranges by the subranging A/D converter, and thence through the network for offsetting the LSB error. These residues are successively converted into groups of successively lesser significant bit subranges and loaded into the appropriate inputs of the binary summer. Loading of successive subrange conversion words into the binary summer is performed with the highest order bit of each subrange conversion (except the first) applied as an over-range to correct any LSB error of the binary sum word resident in binary summer as the result of the preceding conversion. The binary summer combines the successive subrange conversions as a composite feedback signal which is passed to the D/A converter, and the process is iteratively repeated until the M bits of accuracy of conversion is obtained.

BRIEF DESCRIPTION OF THE DRAWINGS

FIG. 5 is a diagrammatic representation depicting the overlapping of successively produced subrange conversion words involved in the operation of the circuit apparatus of FIG. 1;

FIG. 6 is a conceptual schematic of the binary summer of the circuit apparatus of FIG. 1.

DESCRIPTION OF THE PREFERRED EMBODIMENT

Figure 1:
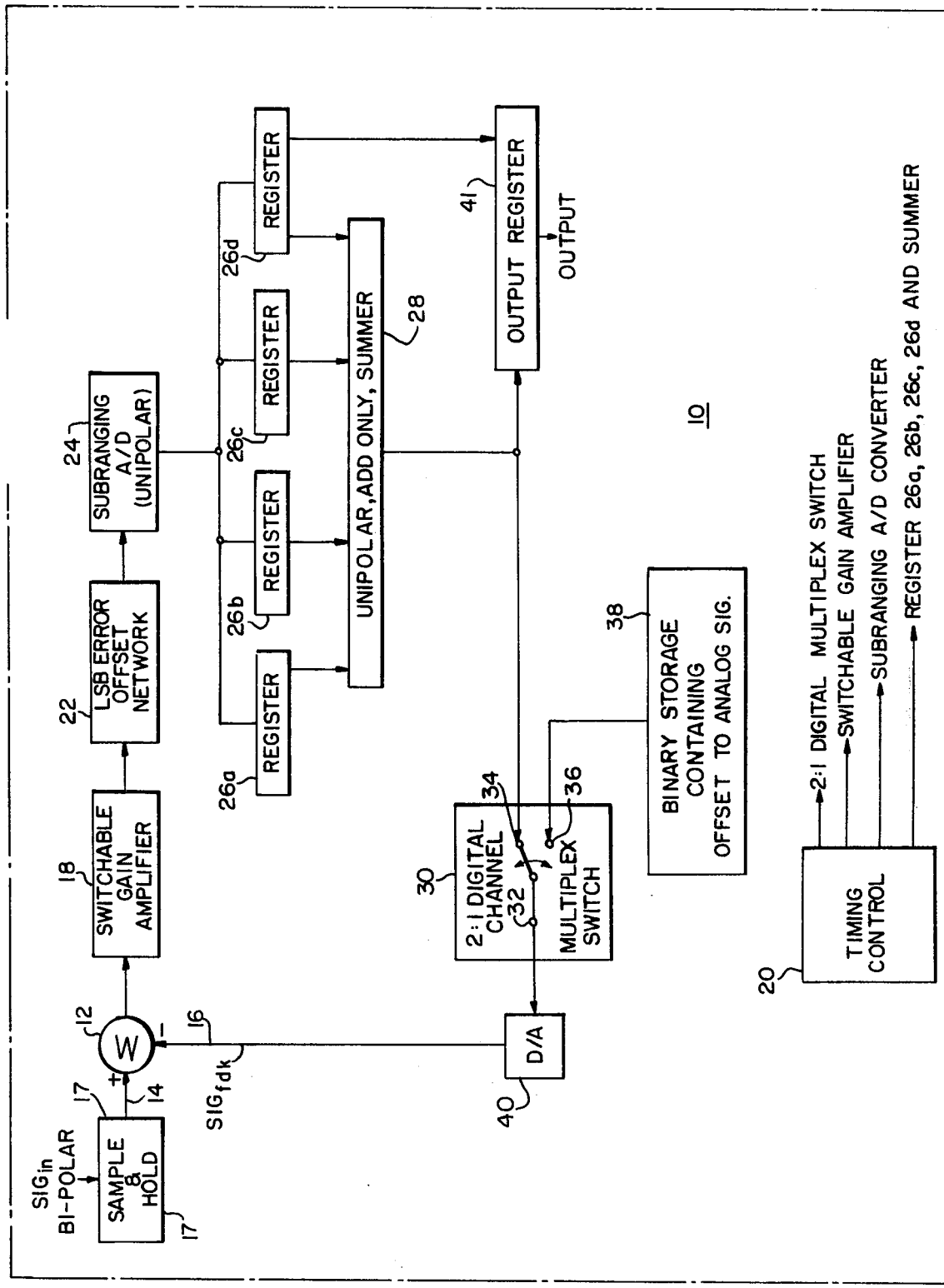
FIG. 1 is a block diagram of analog-to-digital conversion circuit apparatus in accordance with the present invention.

Referring now to the drawings, and more particularly to FIG. 1, analog-to-digital (A/D) conversion circuit apparatus 10, in accordance with the present invention, is of a type finding application in connection with analyses of radar signals. It converts a bipolar analog input signal into a binary number output word containing M bits. In order that the description be made with specific example, it will be assumed that:

$$M = 13.$$

It is to be understood that this value and other numerical values and performance characteristic uses herein as illustrative are for purposes of clarity in describing the invention, and are not to be construed as in any way limiting the concepts of the invention. The numerical values representable by an M bit binary output word represent the total range of the circuit apparatus. A conventional analog signal differential summing junction 12 has an analog input signal, $Sig_{in}$ applied to one input 14 thereof and an analog feedback signal $Sig_{fdk}$ applied to the other input 16. However it is to be understood that in appropriate circumstances $Sig_{in}$ is first applied to a conventional sample and hold stage 17. For illustrative purposes, $Sig_{in}$ will be assumed to be a bipolar signal having a value which varies between the range ±1.30 volts. Its magnitude and polarity may for example represent bipolar angular bearing. The nature of $Sig_{fdb}$ will become apparent as the description proceeds. Differential summing junction 12 combines these signals in a subtractive phase, as indicated by the plus (+) and minus (−) symbols shown on the drawing, producing an output signal representing $Sig_{in}$ minus $Sig_{fdb}$ which is sent to a conventional switchable gain amplifier 18. Amplifier 18 functions as an adjustable gain means in the operation of circuit 10. Amplifier 18 is of conventional design which provides gain increments of $2^{(n-1)(S-1)}$ in the iterative conversion of subranges by circuit 10 under control of a timing control circuit 20, which controls the iterative action of circuit 10. In the foregoing equation n equals the sequential number of subrange conversion which is being processed by the switchable gain amplifier. The output of amplifier 18 is in turn applied to a least significant bit (LSB) error offset network 22 and thence to the internal, subranging analog-to-digital (A/D) network 24. LSB error offset network 22 serves to offset the input to subranging A/D converter 24 in a manner such that it makes all subsequent residue from operation of the subranging A/D converter 24 positive. The construction and operation of network 22 will be described in detail in connection with FIGS. 2, 3, 4A and 4B. Subranging A/D converter 24 is of conventional unipolar, fixed reference, type which is adapted to receive a unipolar voltage at its input and to produce at its output a binary number output word having a value which corresponds to the magnitude of the analog input with LSB error tolerances of ± ½ LSB. For purposes of illustration, it is assumed that subranging A/D converter 24 is only capable of processing positive voltage analog signals. The binary number output word is in the form of a series of S simultaneously present bit signals which individually represent values of the series of the binary number system digital position values. For illustrative purposes it will be assumed that:

$$S = 4.$$

Therefore, the output of subranging A/D converter consists of four simultaneously present bit signals. The outputs of subranging A/D converter are selectively coupled or loaded into one of four digital storage registers 26a, 26b, 26c and 26d. The number of such registers is equal to the total number of successive iterations of subrange conversions, N, needed to produce the M bits of the binary number output word of circuit apparatus 10. With the assumed values of $M=13$, $S=4$, and the use of one bit of the second and subsequent outputs of the subranging A/D converter in an overlap relationship (to be explained later in detail) with the LSB of the previous output, the total number of steps is:

$$N = 4.$$

The operation of and selective coupling or loading of successively produced subrange conversion words into registers 26a, 26b, 26c and 26d is accomplished by means of transfer gates (not shown), or the like, which are selectively actuated by the timing control 20, to transfer each of the successively produced conversion words into registers 26a, 26b, 26c and 26d in that order. For the illustrative values of $M=13$ and $S=4$, it can be shown that binary summer 28 must have at least a capacity of $M-(S-1)$, or 10 binary storage elements. Binary summer 28 includes conventional binary arithmetic logic circuitry for performing unipolar, add-only, binary arithmetic. It is also clocked by timing control 20. The arithmetic logic circuitry further forms the signal intake terminals for receiving successive subrange conversion words to be added to the binary sum word resident in the register stages as the result of the preceding subrange conversion. After each successive subrange conversion, the subrange conversion word which has been newly placed in one of the digital storage registers 26a, 26b, 26c and 26d is then switched to the appropriate group of inputs of binary summer 28. However, in the case of register 26d only the most significant bit (MSB) is applied to the summer, and the rest of the bits may be directly utilized as an output. The arrangement of interconnection of the bit positions of the registers 26a, 26b, 26c and 26d and the inputs of binary summer 28 provides an overlap of subrange conversion words in the summer. The MSB of the second and subsequent subrange conversion words overlap with the LSB of the respective preceding subrange conversion word. This will be described in detail in connection with FIGS. 5 and 6. A conventional two-to-one (2:1) digital channel multiplex switch 30 alternatively passes to its output 32 either of: (A) an input applied to an input 34, or (B) a signal applied to an input 36. It is to be understood that although switch 30 is schematically shown as a simple single-pole-double-throw switch, it is in fact gating logic which switches a plurality of bit signals. Switch 30 operates under control of timing control 20 to pass the signals at the input 36 to its output 32 prior to the first step of subrange conversion. The purpose of this will become understood as the description proceeds. Timing control 20 then actuates 2:1 channel multiplex switch 30 to the condition in which it applies the signals at input 34 to output 32 prior to the second and subsequent steps of subrange conversion. A conventional digital storage circuit 38 of any suitable construction holds a predetermined fixed binary number word which is related to the expected maximum possible magnitude of negative polarity of the bipolar analog input signal, $Sig_{in}$, and is also related to the operating range of unipolar subranging A/D converter 24. This predetermined count condition is chosen to offset the largest negative polarity input signal which can be expected by an amount sufficient to produce a positive output from differential summing junction 12.

For illustrative purposes it will be assumed that subranging A/D converter has the capability of handling an input swing of zero volts to +2.6 volts. Using the previously assumed illustrative range of $Sig_{in}$ of ± 1.30 volts, the binary count which should be held in the binary storage circuit 38 is that binary count which will result in an output of D/A converter of −1.30 volts.

The digital sum word from binary summer 28 is applied to input 34 of the 2:1 digital channel multiplex switch. This digital sum word consists of the simultaneous presence of the series of the signals representing the binary sum word resident in the storage elements of summer 28. As previously described the numerical value of the binary sum word resident in the storage elements is the result of the successive combination by additions, with overlap, of the successively produced subrange conversion words. This is done by applying the successively produced subrange conversion words to preselected groups of inputs of summer 28 as will be described in detail in conjunction with FIG. 6.

The signals which pass through 2:1 channel multiplex switch 30 to its output terminal 32 are applied to a conventional digital-to-analog (D/A) converter 40. The last subrange conversion does not have to be reconverted to analog, and therefore D/A converter can have less than M bit input capacity. However, it must have M bit linearity. The output of D/A converter 40 is, in turn, applied to the subtractive phase input 16 of differential summing junction 12.

The output of circuit 10 consists of the binary sum word resident in the storage elements of binary summer 28 at the conclusion of the Nth step of subrange conversion, plus the bits from those storage positions of register 26d which are not applied to summer 28. This output is, in turn, passed to a final output register 41 of circuit 10. Although the signal present in final output register 41 represents a bipolar input, it will in form be a offset binary count signal.

Figure 2:
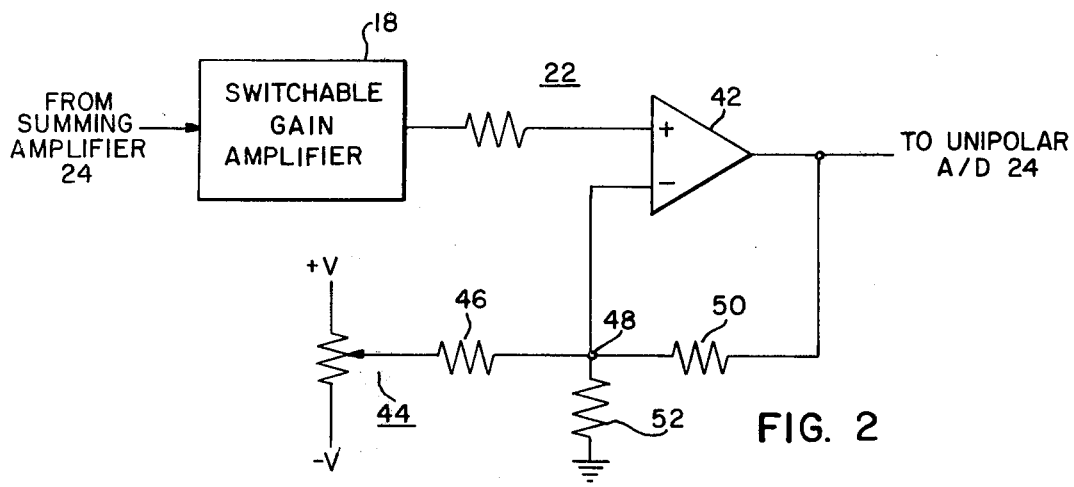
FIG. 2 is a schematic of the least significant bit offset network of the circuit apparatus of FIG. 1.

The structure and operation of LSB error offset network 22 will now be described. Reference is first made to FIG. 2 for a detailed description of the network 22. Network 22 includes a fixed gain differentially summing amplifier 42. The output of switchable gain amplifier 18 is applied to the non-inverting signal intake terminal of amplifier 42. A wiping arm potentiometer 44 has its resistance element connected between positive and negative sources of supply. The voltage picked off by the wiper is coupled through a resistor 46 to a junction point 48. A feedback resistor 50 is connected from the output of amplifier 42 to junction point 48. A scaling resistor 52 is connected from junction point 48 to the ground, or whatever other potential is established as the reference potential. Junction point 48 is connected to the inverting signal intake terminal of amplifier 42. In accordance with well-known operational amplifier principles, the voltage picked off by the wiper of potentiometer 44 is applied and differentially combined with the signal from switchable gain amplifier 18.

Figure 3:
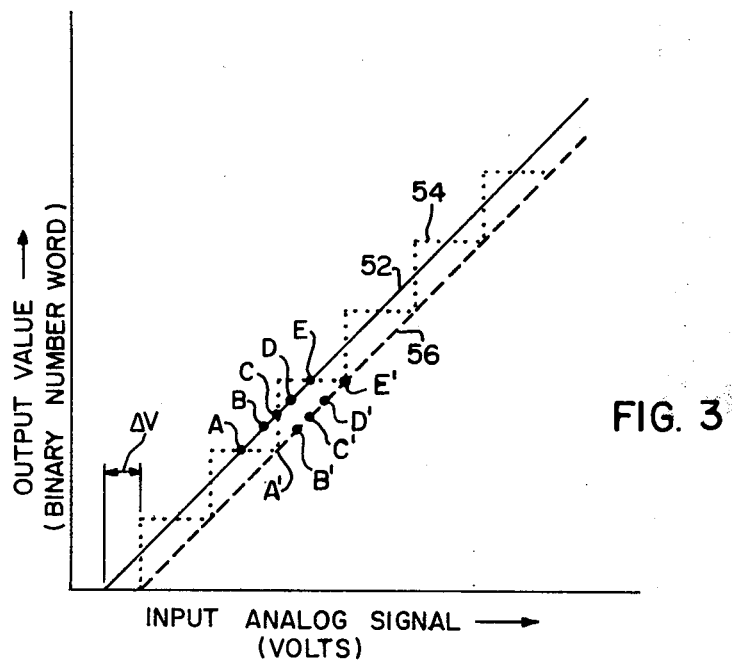
FIG. 3 is a graph presented to aid in describing the operation of least significant bit error offset network of FIG. 2.
Figure 4A:
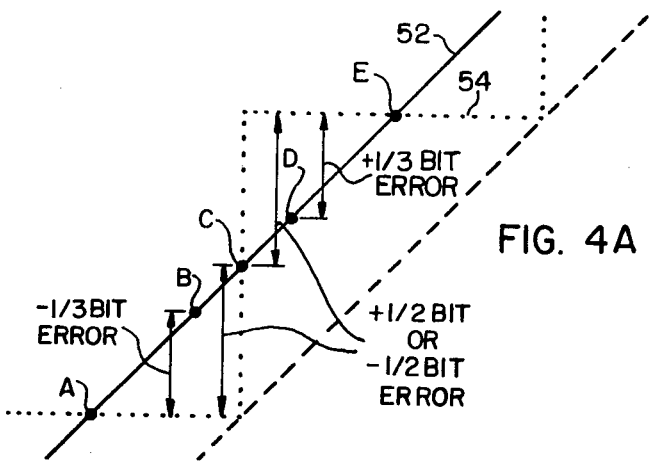
FIGS. 4A and 4B are enlarged details of FIG. 3 showing the Least Significant Bit (LSB) errors for a series of signal magnitudes emanating from the adjustable gain amplifier of FIG. 1 for two cases consisting of: (A) the case of the operation of the subranging A/D converter stage alone without any preprocessing to provide LSB error offset; and (B) the case of the operation of the subranging A/D converter with the LSB error offset network connected to preprocess the A/D converter input signal before its application to the subranging A/D converter.

Reference is now made to FIGS. 3 and 4A for a description of the Least Significant Bit (LSB) error characteristic of subranging A/D converter 24 when operating solely in and of itself, i.e. without LSB offset network 22 connected to preprocess the input signal thereto. The abscissa of the graph of FIG. 3 represents magnitude of input analog signal (volts) applied to subranging A/D converter 24, and the ordinate represents output value (binary number word) to which the input is converted. Solid line 52 represents possible magnitudes of voltage applied from switchable gain amplifier 18. Points A, B, C, D and E represent an exemplary series of analog signals from amplifier 18 of increasing magnitude along line 52. The significance of line 52 is simply that the possible iputs are continuous. The stair-shaped dotted line 54 represents the subranging A/D output values (ordinal values) resulting from various analog input magnitudes (abscissal values). Line 54 represents that the output values are in the form of steps of output value. The magnitude of each vertical step of dotted line 54 is equal to the binary number system digital position value of the least significant bit of subrange conversion word produced by subranging A/D converter 24. The vertical distance between solid line 52 and dotted line 54 is the magnitude of difference between the binary number output word value and the equivalent magnitude of input analog signal which produced the output word. This difference is sometimes hereinafter and in the claims, referred to as a "least significant bit error" or "least significant digit error", or "LSB error", or "LS error", and is expressed relative to the least significant bit or least significant digit in the sense that they are values. As may be seen from FIG. 4A, the LSB errors for the series of input signal values A, B, C, D and E roughly are: zero; −⅓ bit; + ½ bit or −½ bit (point of ambiguity); + ⅓ bit; and zero. It will be apparent that the LSB error value is bipolar, with the range ±½ LSB.

Figure 4B:
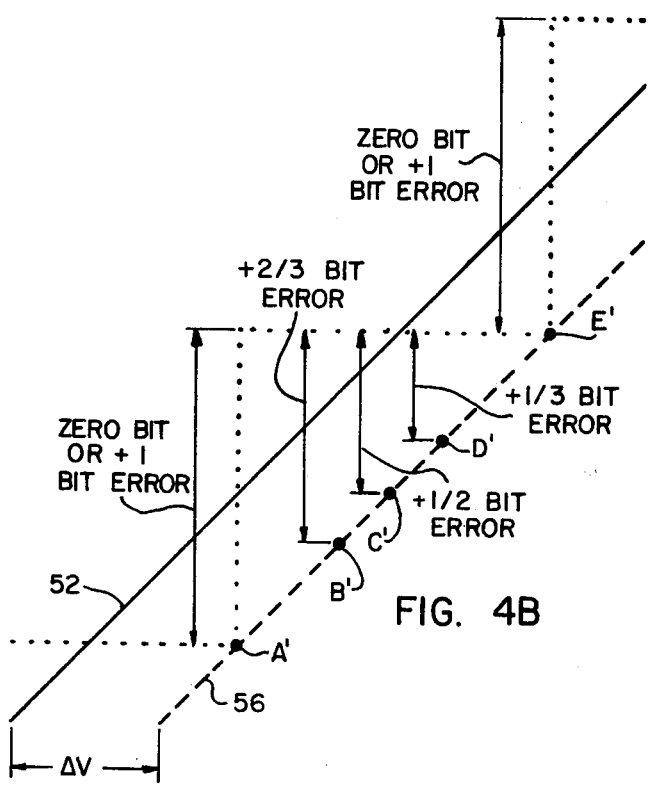

Reference is now made to FIGS. 3 and 4B for a description of the LSB error characteristics of the combined operation of LSB error offset network 22 and subranging A/D converter 24. An adjustment of potentiometer 44 (FIG. 2) is made prior to use of circuit 10, as follows. For the assumed situation of unipolar subranging A/D converter 24 which processes positive polarity signals, the wiper arm of potentiometer 44 is moved to pick off a voltage which when differentially summed with the positive analog signals at the output of selective gain amplifier will shift such output by a positive amount, $\Delta V$, sufficient to move the line representing possible magnitudes of voltage applied from switchable gain amplifier from the position of solid line 52 to the position of dashed line 56 which impinges against the low corner points of stair-shaped dotted line 54. This shifts the series of exemplary values A, B, C, D and E to new positions A′, B′, C′, D′ and E′. As shown in FIG. 4B the LSB errors for the shifted series A′, B′, C′, D′, and E′ are: +1 bit or zero bit (point of ambiguity); +⅔ bit; +½ bit; +⅓ bit; and zero bit or +1 bit (point of ambiguity). It will be apparent that the effect of LSB error offset network 22 is to cause subranging A/D converter 24 to generate binary number output words in a way that produces only positive LSB errors. In the context of use of an A/D converter as a subranging converter in a digital-to-analog conversion circuit employing feedback-type successive subranging, this means that the residue from each step of conversion can only be zero or of positive polarity, and cannot be of negative polarity.

Reference is now made to FIGS. 5 and 6 for a more detailed description of binary summer 28 and how it provides an overlap of the most significant bit (MSB) of the second and subsequent subrange conversion words with the least significant bit (LSB) of each respective next preceding subrange conversion word. FIG. 5 is a conceptual schematic representation of the relative alignment of the digits of subrange conversion words $S_1$, $S_2$, $S_3$ and $S_4$ in the loading of them into the binary summer 28, and in the direct connection to the final output register 41 of the three least significant bits from register 26d. FIG. 6 is a conceptual schematic representation of the way in which the bit signals from registers 26a, 26b, 26c and 26d are coupled to input side of the add logic associated with each summing element of binary summer 28. Summer 28 has a series of ten 10 binary digit summing elements $s_0, s_1, \ldots s_9$. Of these elements $s_0$, $s_3$ and $s_6$ are the summing elements for overlap bits. The latter summing elements each have a pair of inputs. One of each such pair of inputs is for the LSB of the subrange conversion word produced by means of internal A/D converter 24 for a given subrange, and the other is for the MSB of the subrange conversion word produced for the next successive subrange. The input side of the adder logic associated with the other summing elements $s_1$, $s_2$, $s_4$, $s_5$, $s_7$, $s_8$ and $s_9$ receive only a single input. Summer 28 is constructed of conventional add-only logic gate circuitry for unipolar numbers 58. The respective subrange conversion words $S_1$, $S_2$, $S_3$, and $S_4$ are successively clocked into the input sides of adder logic 58 as addend signals. Each time an addend signal is applied, adder logic 58 responds to produce a binary sum word in the storage elements which is representative of the sum of the addend signal and the preexisting binary number word in the storage elements. (The latter pre-existing word is the result of the preceding subrange, if any.) This adding action takes place "momentarily", but in fact requires some finite "settling time". The logic gate circuitry performs the necessary binary addition of each bit signal applied to an individual input of the binary summer 28 and propogates "carries" to the higher order summing elements of the series. The binary sum word is available at the plurality of outputs emanating from the output side of each summing element of summer 28.

The described overlapping of bits in additive combining of subrange conversion words is for the purpose of error correction. The highest order of bit for each successive processing of a subrange by A/D converter 24 is actually one bit of over-range to the particular subrange being processed. The purpose of this one bit of over-range is to correct for any errors up to the ± ½ LSB range of error inherent to A/D converter operation. (In the present invention the ± ½ LSB error is shifted to a 0 to 1 LSB range of error). The principles of such use of over-range with overlap is, in and of itself, old. It is present in the patents cited in the preamble discussion of prior art. However, the present invention is the first known instance of these principles being implemented with the novel cooperation with other elements of circuit 10, which produces resultant simplification, and settling speeds heretofore unobtainable.

Reference is again made to FIG. 1, this time for a description of the operation of circuit 10. At the start of a conversion of a bipolar analog input signal, the 2:1 digital channel multiplex switch 30 is in its condition in which it applies the signal from its input 36 to its output 32. Accordingly, the predetermined fixed binary number word from digital storage circuit 38 is applied to the D/A converter 40. The output of D/A converter 40 is an analog offset signal going into the differential summing junction 12. The application of this analog offset signal is operative to offset the largest negative polarity input signal which can be expected, so that the difference signal from junction 12 will always be a positive, unipolar signal. The general expression for the gain of switchable gain amplifier 18 is:

$$G = 2^{(n-1)(S-1)},$$

where $n$ is the sequential number of the subrange conversion being processed. For the first conversion the gain equals unity. Hence, for the first step of iterative subrange conversion the difference signal from junction 12 is passed with unity gain to LSB error offset network 22. Network 22 provides the small shift in voltage level for LSB error offset before the signal is applied to subranging A/D converter 24. Converter 24 produces at its output the first S bit subrange conversion word, $S_1$, which in value represents the subrange constituting the most significant bits of the output of circuit apparatus 10. Word $S_1$ is then switched or clocked into storage register 26a and thence into binary summer 28. Under control of timing control 20, the 2:1 channel multiplex switch 30 is actuated into its condition of applying the signal from input 34 to its output 32. Subrange conversion word, $S_1$, passes through switch 30 to D/A converter 40 where it is converted to an analog signal having a magnitude equivalent to the numerical value of subrange conversion word $S_1$. In summing junction 12 the magnitude of analog output of converter 40 is subtracted from the bipolar analog input signal, $Sig_{in}$. The new difference signal, or residue, goes through the gain switchable amplifier where this time it is amplified by $2^{(n-1)(S-1)}$ where $n = 2$, which is a gain of 8. This brings the difference up to a level required to provide the conversion to the next successive subrange of S bits including the one bit of over-range to enable overlapping of bits.

This feedback process is iterated with the output of the successive A/D conversion going into registers 26b, 26c and 26d, respectively, and then into the binary summer 28 followed by return propagation of the combined signal from summer 28 to the summing junction point. The feedback cycle is repeated until enough conversions have been made to produce M bits at the output.

ADVANTAGES OF THE INVENTION

Certain advantages of the invention will be apparent from the foregoing description. The initial offset produced by the introduction of the predetermined fixed binary offset value from binary storage 28 during the first cycle of subrange conversion insures that every input signal going into the subranging internal converter 24 on its first cycle of operation is positive (i.e. more broadly, unipolar). Further, the LSB error offset produced by network 22 makes residues positive. Among the advantage achieved by these features are:
1. Internal subranging A/D converter 24 can be a unipolar A/D converter allowing all of the bits of the converter to be used in each subrange.
2. The digital adding logic needed for combining successively produced subrange conversion words need only be implemented for positive signals and by means of add-only arithmetic logic circuitry. This enables combining of successive subrange words by the single level binary summer 28.

The importance of enabling use of a unipolar internal A/D converter will become apparent when one compares the operation of circuit 10 with that of a hypothetical prior art construction (not shown) in which one of the converter flip-flops is used as a sign bit. A subranging A/D converter made of integrated circuit construction would typically have a capacity of four (4) flip-flop stages. It is further assumed that one of the bits is used for overlap. If one of the flip-flop stages must be used as a sign bit, conversion to a thirteen bit representation takes six (6) iterative cycles because the subrange output words S' would contain only three (3) binary bits each. (This is to be compared to the four (4) iterative steps required with the present invention.)

Figure 7:
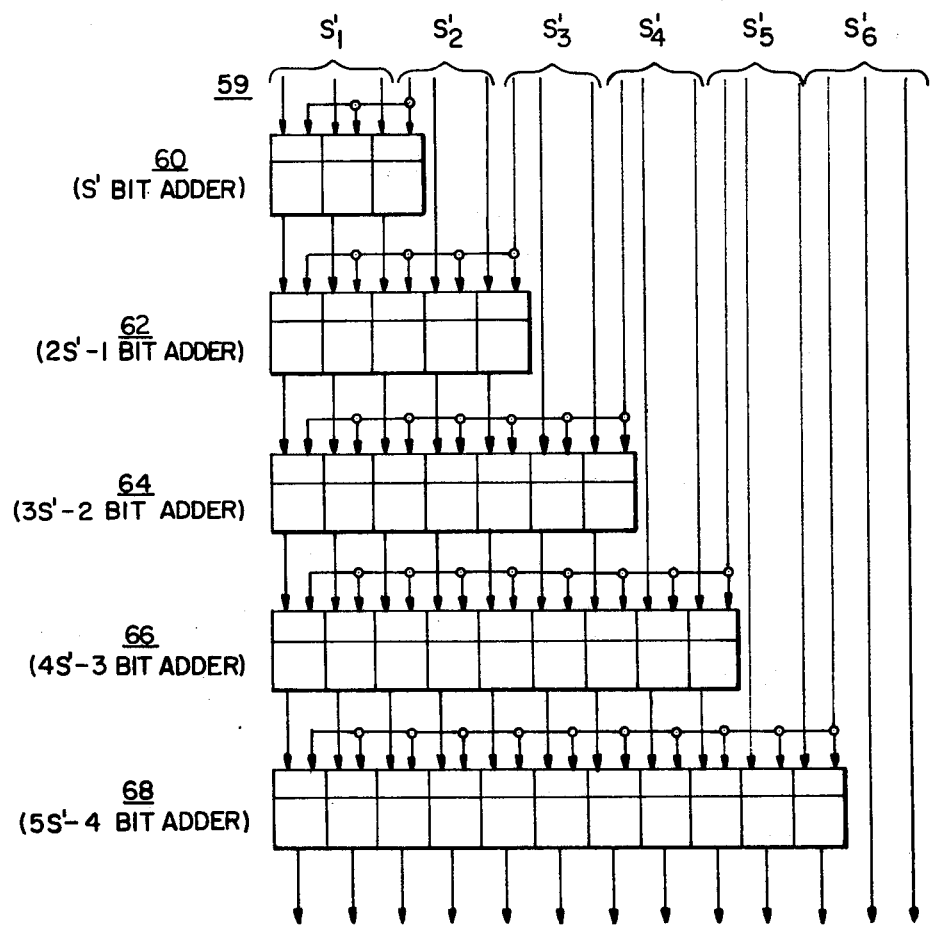
FIG. 7 is a conceptual schematic like that of FIG. 6 of a hypothetical prior art approach, presented for comparison purposes.

The importance of being able to use a single-level, unipolar, add-only, adder for binary summer 28 will become apparent when one compares the operation of circuit 10 with that of the hypothetical prior art construction of multi-level summer 59 shown in FIG. 7. Summer 59 is the type of circuit which would be needed if the subrange conversion word from the subranging A/D converter were bipolar and/or had bipolar LSB errors. As explained in the last paragraph, a subranging A/D converter of conventional construction from an integrated circuit of four flip-flop stages would provide a subrange conversion word S', containing only three (3) binary bits, so that six subrange conversion words $S'_1, S'_2 \ldots S'_6$ must be combined. The form of bipolar arithmetic logic needed for handling the combining of these words would typically be of the so-called (two's complement) type providing a ONE condition in the MSB position for negative polarity and a ZERO condition for positive polarity. A plurality of levels of bipolar adders consisting of adders 60, 62, 64, 66, and 68 are required to combine the subrange conversion words $S'_1, S'_2 \ldots S'_6$. For the bipolar case it is impossible to predict whether addition or subtraction is required in the combining operation for each successive iteration. An S' bit adder 60 is provided to process the combination of subrange conversion words $S'_1$ and $S'_2$. The over-range bit of next subrange conversion word $S'_2$ must be extended and added to the inputs for each other summing element of adder 60. The resultant sum taken from the output leads plus the remaining bits of word $S'_2$ are then added with the over-range bit of word $S'_3$ to the inputs of an adder 62 having a 2S'-1 bit capacity. The sign bit of subrange conversion word $S'_3$, must again be extended and added to all the inputs from the output side of adder 62 because it is not known whether the sign bit of word $S'_3$ will require the adder to work positive or negative. This process continues with the balance of subrange conversion words and the separate adders shown in FIG. 6. It will be apparent that each iterative input requires another adder, each time with more bits than the previous one.

It will be apparent that what is provided is a large dynamic range A/D converter having greater speed than heretofore obtainable.

MODIFICATIONS AND ALTERNATE FORMS OF INVENTION

While the invention has been shown as requiring a 2:1 digital channel multiplex switch, it will be appreciated that such multiplexer could simply be a series of parallel OR gates with the output of binary summer 28 zeroed, and the initial offset set through the second input of each OR gate arrangement during the first step of subrange conversion.

While the invention is shown with a one bit overlap for increased accuracy, it is to be understood that the principle of overlapped bits can also be implemented by the overlapping of a greater number bits. This is in accordance with known principles.

Although the invention has been illustrated in a system employing binary arithmetic logic, it could also be implemented in systems using octal or other radix number systems.

What is claimed is:

1. Apparatus for converting a bipolar analog input signal to a digital number output word composed of a total series of M digits, said apparatus comprising:
   a. analog signal differential summing means having first and second inputs and operative to provide an output signal representing the magnitude of signal applied to the first input less the magnitude of signal applied to the second input;
   b. a subranging analog-to-digital (A/D) converter for converting an analog input signal of predetermined signal polarity into a subrange conversion word consisting of a digital number word having predetermined number, S, of digits, where S is less than M;
   c. adjustable gain means, the output signal of the analog signal differential summing means being applied to the input of the subranging A/D converter through said adjustable gain means;
   d. a digital summer having a series of digital summing elements in excess of S, and having at least one input associated with each summing element, said digital summer being operative in response to a digital addend signal applied to one or more of its inputs to produce a digital sum word in the summing elements which is representative of the sum of the addend signal and the preexisting binary number word in the summing elements;
   e. a digital-to-analog (D/A) converter for converting a digital number word to an analog signal, said D/A converter having its output connected to the second input of the analog differential summing means;
   f. timing control means for iteratively actuating the subranging A/D converter to convert the analog signal present at its input upon each iterative actuation;
   g. means for applying successively produced subrange conversion words to predetermined groups of inputs of the digital summer to combine them in such manner that each resultant successive digital sum word is a composite representation of the most significant bit subrange conversion and one or more lesser significant bit subrange conversion words with the digits of such successive subranges in the summing element positions which correspond to the appropriate subranges of the said series of M digits, said means for applying subrange conversion words operating in predetermined timed relationship to the operation to the timing control means;
   h. means for shifting the voltage level of the bipolar analog input signal by a predetermined magnitude and polarity of shift to transform any bipolar analog input signal of a polarity other than said predetermined polarity into a signal of said predetermined polarity, said means for shifting the voltage level being operative only with respect to the initial subrange conversion performed by the subranging A/D converter;

i. means for applying each successively produced digital sum word in the summing elements of the digital summer to the input of the D/A converter in predetermined timed relationship to the operation of the timing control means such that the second subrange conversion, and successive subrange conversions thereafter, are performed upon the difference between the bipolar analog input signal and the analog equivalent of the digital sum word in the summing elements as the result of the next preceding subrange conversion;

j. means for varying the gain of the adjustable gain means in predetermined timed relationship to the operation of the timing control means to cause the subrange conversion words successively produced by the subranging A/D converter to be representative of the conversion of the residue of the bipolar analog input signal after previous subrange conversions are subtracted therefrom; and k. said means for shifting the voltage level of the bipolar analog input signal comprises a means for applying a binary number word representing a predetermined numerical value to the input of the D/A converter prior to the first subrange conversion.

* * * * *